(12) United States Patent
Li et al.

(10) Patent No.: US 10,504,933 B2
(45) Date of Patent: Dec. 10, 2019

(54) ARRAY SUBSTRATE, DISPLAY PANEL AND DISPLAY DEVICE

(71) Applicants: BOE TECHNOLOGY GROUP CO., LTD., Beijing (CN); Chongqing BOE Optoelectronics Technology Co., Ltd., Chongqing (CN)

(72) Inventors: Shaoru Li, Beijing (CN); Hee Cheol Kim, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/941,322

(22) Filed: Mar. 30, 2018

(65) Prior Publication Data
US 2019/0096911 A1    Mar. 28, 2019

(30) Foreign Application Priority Data

Sep. 25, 2017   (CN) .................... 2017 2 1239511 U

(51) Int. Cl.
*H01L 27/12*      (2006.01)
*H01L 29/786*     (2006.01)
*G02F 1/1362*     (2006.01)

(52) U.S. Cl.
CPC ...... *H01L 27/124* (2013.01); *G02F 1/136209* (2013.01); *G02F 1/136286* (2013.01); *H01L 29/78633* (2013.01); *G02F 2201/121* (2013.01); *G02F 2201/123* (2013.01)

(58) Field of Classification Search
CPC .................. H01L 29/78633; H01L 27/124
USPC ............................... 349/42, 46, 110
See application file for complete search history.

(56) References Cited

U.S. PATENT DOCUMENTS

| | | | | | |
|---|---|---|---|---|---|
| 5,953,088 | A | * | 9/1999 | Hanazawa | G02F 1/136213 349/110 |
| 6,400,427 | B1 | * | 6/2002 | Hanazawa | G02F 1/136227 349/139 |
| 7,030,947 | B2 | * | 4/2006 | Moon | G02F 1/136209 349/110 |
| 7,804,570 | B2 | * | 9/2010 | Hori | G02F 1/136209 349/110 |

(Continued)

*Primary Examiner* — David Vu
*Assistant Examiner* — Brandon C Fox
(74) *Attorney, Agent, or Firm* — Calfee, Halter & Griswold LLP

(57) ABSTRACT

The present disclosure relates to an array substrate, a display panel and a display device. The array substrate includes a substrate, data lines, gate lines, and a pixel unit, wherein a pixel electrode and a light shielding portion are disposed in the pixel unit, and for the light shielding portion and the data line corresponding to each other, an orthographic projection on the substrate of the light shielding portion is partially overlapped with an orthographic projection on the substrate of the data line, and wherein a part of each side, that is parallel to the data line, of an orthographic projection on the substrate of the pixel electrode is only overlapped with the orthographic projection on the substrate of the data line, and the other part of the each side is only overlapped with the orthographic projection on the substrate of the light shielding portion.

3 Claims, 3 Drawing Sheets

(56) References Cited

U.S. PATENT DOCUMENTS

| | | | |
|---|---|---|---|
| 8,890,153 B2* | 11/2014 | Fujii | G02F 1/136286 |
| | | | 257/59 |
| 2013/0141481 A1* | 6/2013 | Peng | G02F 1/134309 |
| | | | 345/694 |
| 2017/0285393 A1* | 10/2017 | Kim | G02F 1/136286 |

* cited by examiner

ARRAY SUBSTRATE, DISPLAY PANEL AND DISPLAY DEVICE

CROSS-REFERENCE TO RELATED APPLICATIONS

The present application claims the priority of Chinese Utility Model Application No. 201721239511.4, filed on Sep. 25, 2017, and the entire contents thereof are incorporated herein by reference as part of the present application.

TECHNICAL FIELD

The present disclosure relates to the field of the display technology, in particular, to an array substrate, a display panel and a display device.

BACKGROUND

Since a Thin Film Transistor (TFT) switch and a pixel on a color filter substrate may not be aligned when a curved liquid crystal display is bended, there may be a problem such as light leakage. In order to prevent the light leakage, it is needed to make a Black Matrix (BM) larger, which results in a significant influence on transmittance.

At present, Color-filter On Array (COA) pixel design with light shielding on the TFT side is employed in general. When a gate electrode and a data line are used to shield light, a large coupling capacitance may be produced between the gate electrode and the data line, which results in a serious vertical crosstalk. When a common electrode and the data line are used to shield light, a large coupling capacitance may be produced between the common electrode and the data line, which results in a significant flicker in the screen, and thereby the display may have a poor display effect.

SUMMARY

According to an aspect of the present disclosure, there is provided an array substrate, including a substrate; a plurality of data lines and a plurality of gate lines which are formed on the substrate and crossed with each other; and a pixel unit formed in an area defined by two adjacent data lines and two adjacent gate lines. A pixel electrode and a light shielding portion that corresponds to the data line are disposed in each pixel unit, and for the light shielding portion and the data line corresponding to each other, an orthographic projection on the substrate of the light shielding portion is partially overlapped with an orthographic projection on the substrate of the data line. A part of each side, that is parallel to the data line, of an orthographic projection on the substrate of the pixel electrode is only overlapped with the orthographic projection on the substrate of the data line, and the other part of the each side is only overlapped with the orthographic projection on the substrate of the light shielding portion.

According to an embodiment, in each pixel unit, the pixel electrode includes a first pixel sub-electrode and a second pixel sub-electrode arranged in a column direction of the pixel unit, which are fabricated in a same layer and electrically connected to each other. The first pixel sub-electrode has two sides that are parallel to the data line, an orthographic projection on the substrate of one of the two sides is overlapped with the orthographic projection on the substrate of the data line adjacent to the one of the two sides of the pixel electrode, and an orthographic projection on the substrate of the other one of the two sides is overlapped with the orthographic projection on the substrate of the light shielding portion corresponding to the data line adjacent to the other one of the two sides of the pixel electrode. The second pixel sub-electrode has two sides that are parallel to the data line, an orthographic projection on the substrate of one of the two sides is overlapped with the orthographic projection on the substrate of the data line adjacent to the one of the two sides of the pixel electrode, and an orthographic projection on the substrate of the other side of the two sides is overlapped with the orthographic projection on the substrate of the light shielding portion corresponding to the data line adjacent to the other one of the two sides of the pixel electrode.

According to an embodiment, in each of the pixel units, each of the light shielding portions comprises a first light shielding sub-portion and a second light shielding sub-portion arranged in a column direction of the pixel unit, an orthographic projection on the substrate of a side of the first light shielding sub-portion toward the first pixel sub-electrode is overlapped with the orthographic projection on the substrate of the data line corresponding to the light shielding portion, and an orthographic projection on the substrate of a side of the second light shielding sub-portion away from the second pixel sub-electrode is overlapped with an orthographic projection on the substrate of the data line corresponding to the light shielding portion.

According to an embodiment, the light shielding portion is a metal light shielding layer electrically connected to the gate line.

According to an embodiment, the light shielding portion is a metal light shielding layer electrically connected to a common electrode signal line.

According to an embodiment, the first light shielding sub-portion and the second light shielding sub-portion are electrically connected to each other and disposed in a same layer, an end of the first light shielding sub-portion away from the second light shielding sub-portion is electrically connected to the gate line, and an end of the second light shielding sub-portion away from the first light shielding sub-portion is electrically connected to the common electrode signal line.

According to another aspect of the present disclosure, there is provided a display panel including any one of the above array substrates.

According to another aspect of the present disclosure, there is provided a display device including any one of the above array substrates.

DETAILED DESCRIPTION

Figure 1:
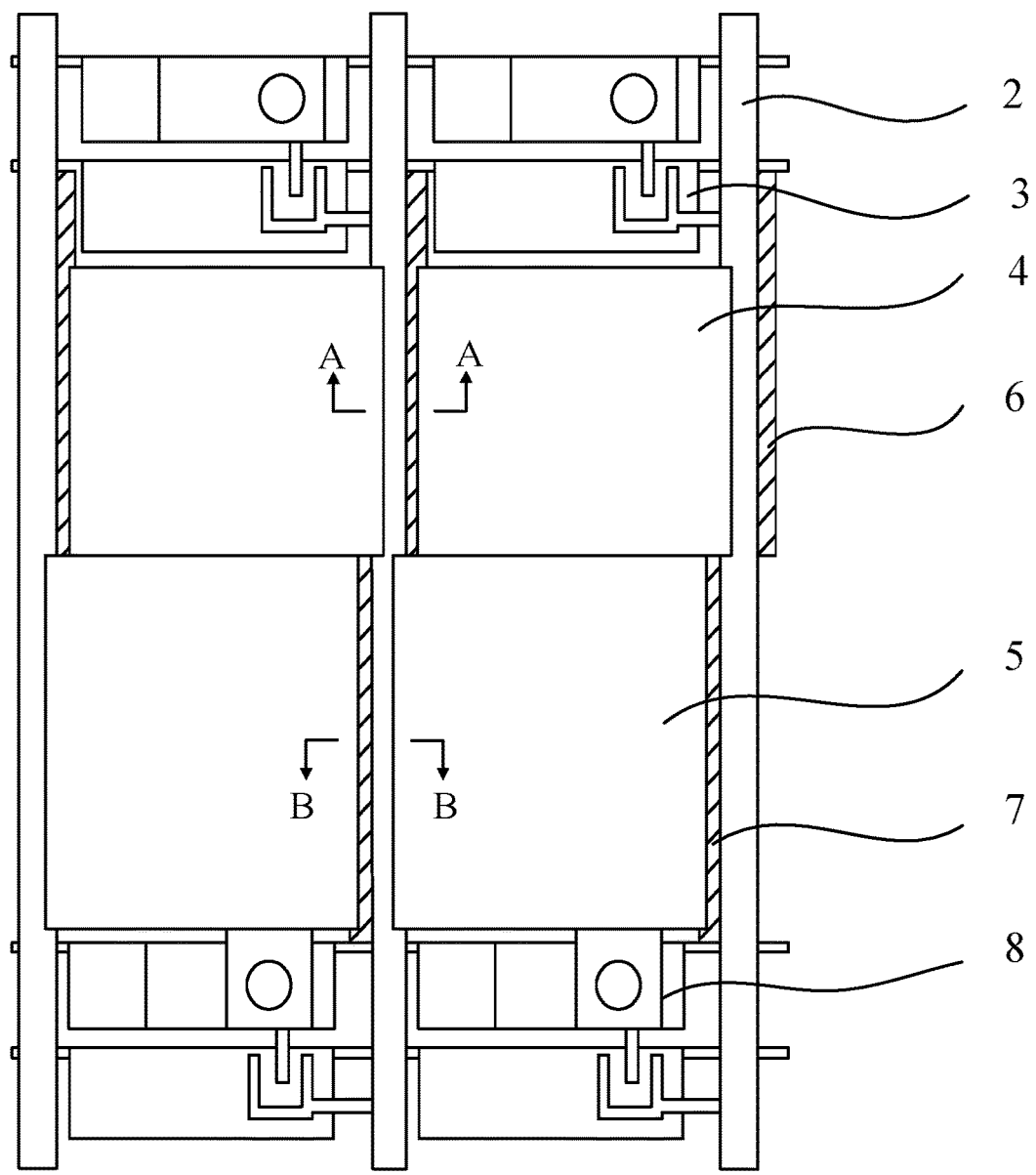
FIG. 1 is a schematic view illustrating a structure of an array substrate according to an embodiment of the present disclosure.

The technical solutions of embodiments of the present disclosure will be described comprehensively and clearly in connection with the appended drawings. It is apparent that the described embodiments are merely a part of the embodiments of the present disclosure and do not represent all embodiments of the present disclosure. All other embodiments made by those skilled in the art without any creative labor fall in the scope of the present disclosure.

Referring to FIGS. 1 to 4, an array substrate according to an embodiment of the present disclosure includes a substrate 1, a plurality of data lines 2 and a plurality of gate lines 3 which are formed on the substrate 1 and crossed with each other, and a pixel unit formed in an area defined by two adjacent data lines 2 and two adjacent gate lines 3. A pixel electrode and a light shielding portion that corresponds to the data line 2 are disposed in each pixel unit. For the light shielding portion and the data line 2 corresponding to each other, an orthographic projection on the substrate 1 of the light shielding portion and an orthographic projection on the substrate 1 of the data line 2 are partially overlapped.

For the pixel electrode, the data line 2 and the light shielding portion, an orthographic projection on the substrate 1 of the pixel electrode has two sides that are parallel to the data line 2. A part of each of the two sides is only overlapped with the orthographic projection on the substrate 1 of the data line 2, and the other part thereof is only overlapped with the orthographic projection on the substrate 1 of the light shielding portion.

The above array substrate includes a substrate 1, a plurality of data lines 2 and a plurality of gate lines 3 which are formed on the substrate 1 and crossed with each other, and a pixel unit formed in an area defined by two adjacent data lines 2 and two adjacent gate lines 3, a light shielding portion that corresponds to the data line 2 is disposed in each pixel unit, and an orthographic projection on the substrate 1 of the light shielding portion is partially overlapped with an orthographic projection on the substrate 1 of the data line 2, therefore the overlapping area between the light shielding portion and the data line 2 is reduced, so that the coupling capacitance between the light shielding portion and the data line 2 is reduced, and the flicker of the screen is alleviated. Meanwhile, a part of each side, that is parallel to the data line 2, of the pixel electrode in the pixel unit is only overlapped with the orthographic projection of the data line 2, and the other part thereof is only overlapped with the orthographic projection of the light shielding portion, therefore the overlapping area of the pixel electrode with the data line 2 is reduced, so that the coupling capacitance between the pixel electrode and the data line 2 is reduced, and the flicker of the screen is alleviated, and thus the vertical crosstalk may be avoided.

In view of the above technical solutions, the technical effects are realized as follows: the coupling capacitance between the light shielding portion and the data line 2 and that between the pixel electrode and the data line 2 are reduced, the flicker of the screen is alleviated, and the vertical crosstalk can be avoided.

Figure 2:
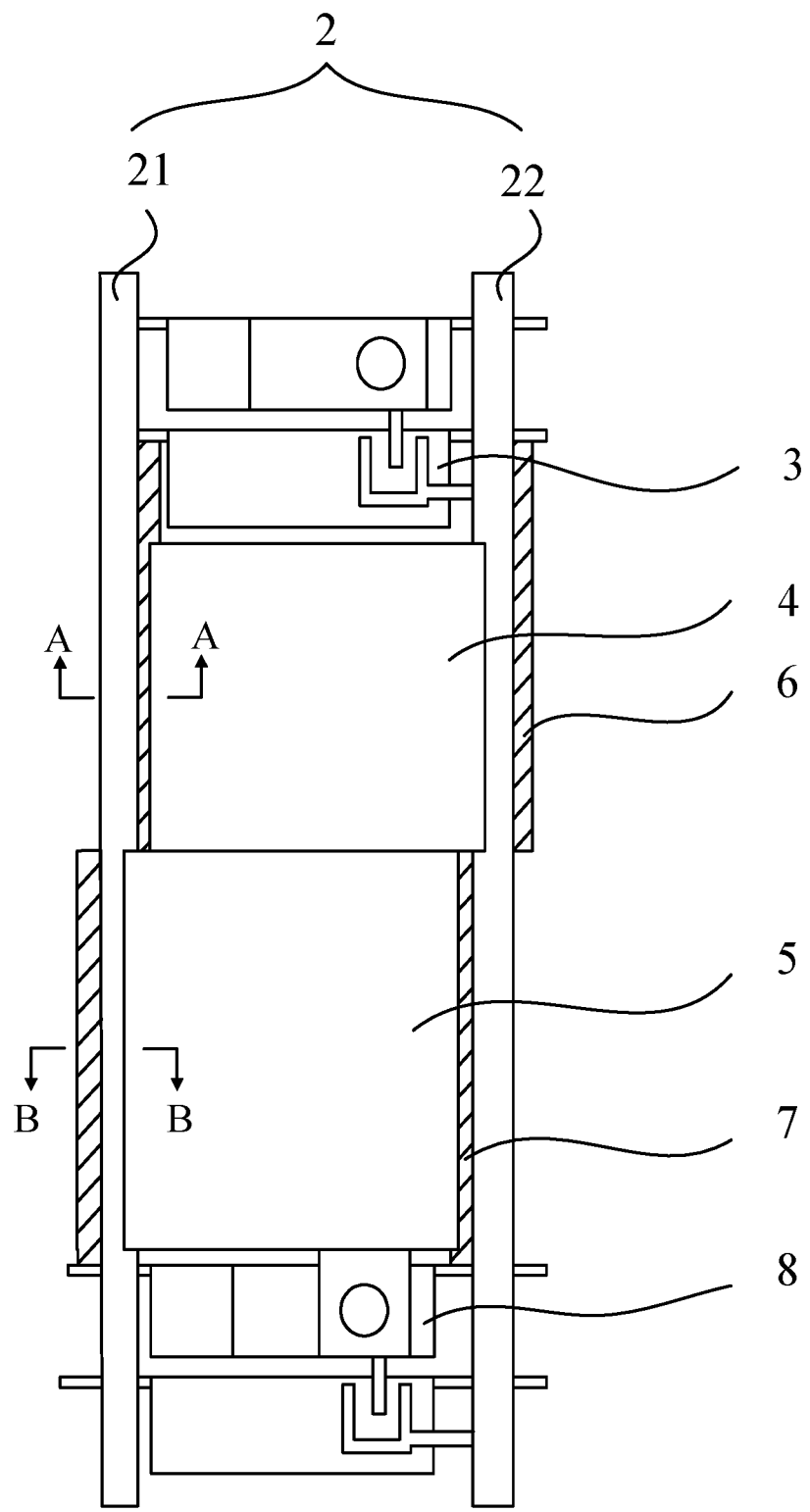
FIG. 2 is a schematic view illustrating a structure of one pixel unit on an array substrate according to an embodiment of the present disclosure.
Figure 3:
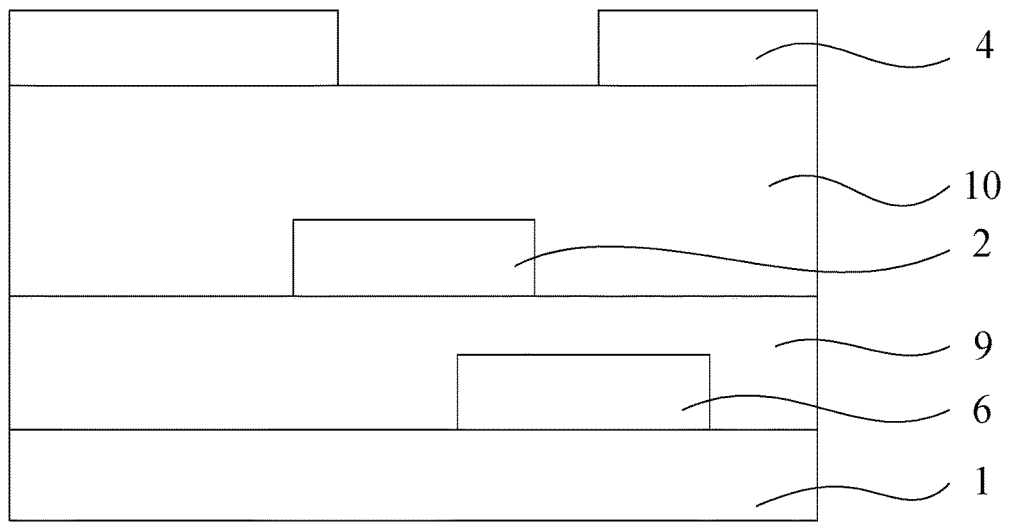
FIG. 3 is a cross-sectional view of FIGS. 1 and 2 taken along the line A-A.
Figure 4:
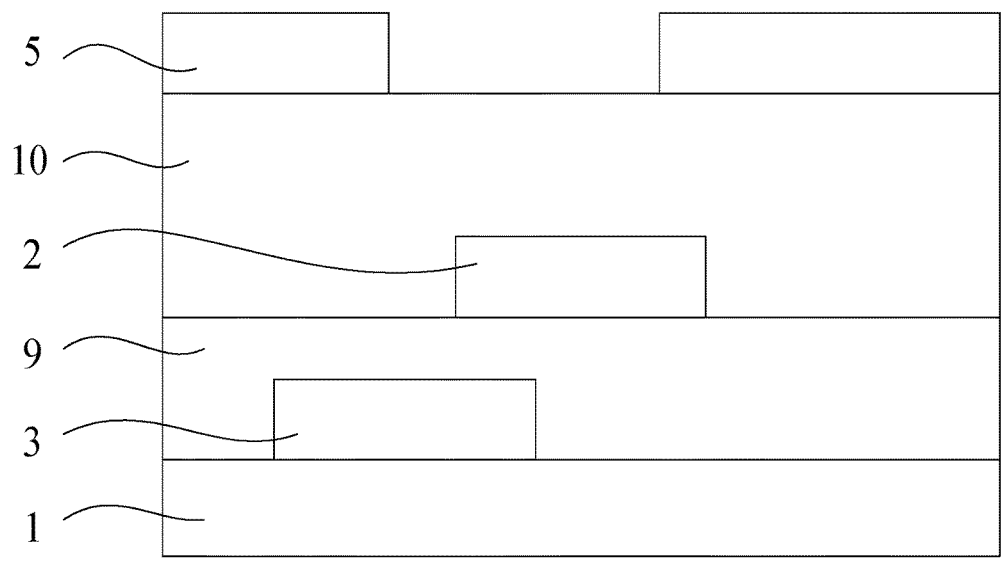
FIG. 4 is a cross-sectional view of FIGS. 1 and 2 taken along the line B-B.

Specifically, as shown in FIG. 2, in each pixel unit, the pixel electrode includes a first pixel sub-electrode 4 and a second pixel sub-electrode 5 arranged in a column direction of the pixel unit, which are fabricated in a same layer and electrically connected to each other. The first pixel sub-electrode 4 has two sides that are parallel to the data line 2, an orthographic projection on the substrate 1 of one of the two sides is overlapped with the orthographic projection on the substrate 1 of the data line 2 adjacent to the one of the two sides of the pixel electrode, and an orthographic projection on the substrate 1 of the other one of the two sides is overlapped with the orthographic projection on the substrate 1 of the light shielding portion corresponding to the data line 2 adjacent to the other one of the two sides of the pixel electrode. The second pixel sub-electrode 5 has two sides that are parallel to the data line 2, an orthographic projection on the substrate 1 of one of the two sides is overlapped with the orthographic projection on the substrate 1 of the data line 2 adjacent to the one of the two sides of the pixel electrode, and an orthographic projection on the substrate of the other side of the two sides is overlapped with the orthographic projection on the substrate 1 of the light shielding portion corresponding to the data line 2 adjacent to the other one of the two sides of the pixel electrode.

As shown in FIG. 2, the first pixel sub-electrode 4 has two sides that are parallel to the data line 21. The orthographic projection on the substrate 1 of one side is merely overlapped with the orthographic projection on the substrate 1 of the data line 22, and the orthographic projection on the substrate 1 of the other side is merely overlapped with the orthographic projection on the substrate 1 of the light shielding portion corresponding to the data line 21. The second pixel sub-electrode 5 has two sides that are parallel to the data line 21. The orthographic projection on the substrate 1 of one side is overlapped with the orthographic projection on the substrate 1 of the data line 21, and the orthographic projection on the substrate 1 of the other side is overlapped with the orthographic projection on the substrate 1 of the light shielding portion corresponding to the data line 22.

In the first pixel sub-electrode 4 and the second pixel sub-electrode 5 included in the above pixel electrode, the center line of the first pixel sub-electrode 4 that is parallel to the data line 2 is parallel to but not coincide with the center line of the second pixel sub-electrode 5, such that the coupling capacitance generated at the first pixel sub-electrode 4 and that generated at the second pixel sub-electrode 5 may compensate each other so as to avoid the fluctuation of the coupling capacitance, which may significantly alleviate the flicker of the screen and the vertical crosstalk.

In each pixel unit, the first pixel sub-electrode 4 is electrically connected to the second pixel sub-electrode 5, and the electrical connection therebetween may be realized as follows.

In a manner, the first pixel sub-electrode 4 and the second pixel sub-electrode 5 may be formed as one pattern by patterning the same transparent conductive layer. That is, the first pixel sub-electrode 4 and the second pixel sub-electrode 5 are formed as an integrated structure, as shown in FIGS. 1 and 2.

In another manner, the first pixel sub-electrode and the second pixel sub-electrode may be formed as two separated patterns respectively and located on the same plane. The first pixel sub-electrode and the second pixel sub-electrode may be connected by a metal bridge (not shown).

In yet another manner, the first pixel sub-electrode and the second pixel sub-electrode may be disposed in different layers respectively, and the first pixel sub-electrode and the second pixel sub-electrode may be electrically connected through a via.

The above three manners are merely exemplary specific examples for realization of the electrical connection between the first pixel sub-electrode and the second pixel sub-electrode and other manners for connecting the first pixel sub-electrode and the second pixel sub-electrode may be used.

As an implementation of the above light shielding portion, in each of the pixel units, each of the light shielding portions includes a first light shielding sub-portion 6 and a second light shielding sub-portion 7 arranged in a column direction of the pixel unit, an orthographic projection on the substrate 1 of a side of the first light shielding sub-portion 6 toward the first pixel sub-electrode 4 is overlapped with the orthographic projection on the substrate of the data line 22, and an orthographic projection on the substrate 1 of a side of the second light shielding sub-portion 7 away from the second pixel sub-electrode 5 is overlapped with an orthographic projection on the substrate 1 of the data line 22.

In the above light shielding portion, only a part of the first light shielding sub-portion 6 is overlapped with a part of the data line 22, and only a part of the second light shielding sub-portion 7 is overlapped with a part of the data line 22, such that, when the orthographic projection of one side of the pixel electrode is overlapped with the orthographic projection of the data line 22, the orthographic projection of the other side may be overlapped with the orthographic projection of the light shielding portion. In this case, the orthographic projection of the pixel electrode is partially overlapped with the orthographic projection of the data line 2, and the orthographic projection of the data line 2 is partially overlapped with the orthographic projection of the light shielding portion. Therefore, the vertical crosstalk and the flicker of the screen may be alleviated.

According to an embodiment of the present disclosure, the light shielding portion is a metal light shielding layer that is electrically connected to the gate line 3.

According to an embodiment of the present disclosure, the light shielding portion may also be a metal light shielding layer that is electrically connected to a common electrode signal line 8.

According to an embodiment of the present disclosure, in each pixel unit, the first light shielding sub-portion 6 and the second light shielding sub-portion 7 are electrically connected to each other and disposed in a same layer. An end of the first light shielding sub-portion 6 away from the second light shielding sub-portion 7 is electrically connected to the gate line 3, and an end of the second light shielding sub-portion 7 away from the first light shielding sub-portion 6 is electrically connected to the common electrode signal line 8. The first light shielding sub-portion 6 and the second light shielding sub-portion 7 being disposed in the same layer is that the first light shielding sub-portion 6 and the second light shielding sub-portion 7 are disposed through a same patterning process.

The first light shielding sub-portion 6 is electrically connected to the gate line 3, the second light shielding sub-portion 7 is electrically connected to the common electrode signal line 8, and the first light shielding sub-portion 6 and the second light shielding sub-portion 7 are electrically connected to each other and disposed in the same layer, which ensures the light shielding function of the light shielding portion and the stable transmission of the electrical signal in the array substrate.

In an embodiment of the present disclosure, a first insulating layer 9 is disposed between the light shielding portion and the data line 2.

In an embodiment of the present disclosure, a second insulating layer 10 is disposed between the data line 2 and the pixel electrode.

Embodiments of the present disclosure also provide a display panel including any one of the array substrates in the above embodiments.

Embodiments of the present disclosure also provide a display device including any one of the array substrates in the above embodiments.

It is apparent for those skilled in the art that various modifications and variants can be made without departing from the spirit and scope of the present disclosure. As a result, if such modifications and variants fall in the scope of appended claims or the equivalent technology thereof, it is intended to encompass such modifications and variants for the present disclosure.

What is claimed is:

1. An array substrate, comprising:
   a substrate;
   a plurality of data lines and a plurality of gate lines which are formed on the substrate and crossed with each other; and
   a pixel unit formed in an area defined by two adjacent data lines and two adjacent gate lines,
   wherein the pixel unit comprises a pixel electrode and a light shielding portion that corresponds to the data line, and wherein an orthographic projection of the light shielding portion on the substrate is partially overlapped with an orthographic projection of the corresponding data line on the substrate, and
   wherein, each side, that is parallel to the data line, of an orthographic projection of the pixel electrode on the substrate comprises a first part which is overlapped only with the orthographic projection of the data line on the substrate and a second part which is overlapped only with the orthographic projection of the light shielding portion on the substrate,
   wherein the pixel electrode comprises a first pixel sub-electrode and a second pixel sub-electrode, both arranged in a column direction of the pixel unit, fabricated in a same layer and electrically connected to each other,
   wherein the first pixel sub-electrode has two sides that are parallel to the data line, an orthographic projection of one of the two sides on the substrate is overlapped with the orthographic projection of the data line adjacent to the one of the two sides of the pixel electrode on the substrate, and an orthographic projection of the other one of the two sides on the substrate is overlapped with the orthographic projection of the light shielding portion corresponding to the data line adjacent to the other one of the two sides of the pixel electrode on the substrate,
   wherein the second pixel sub-electrode has two sides that are parallel to the data line, an orthographic projection of one of the two sides on the substrate is overlapped with the orthographic projection of the data line adjacent to the one of the two sides of the pixel electrode on the substrate, and an orthographic projection of the other side of the two sides on the substrate is overlapped with the orthographic projection of the light shielding portion corresponding to the data line adjacent to the other one of the two sides of the pixel electrode on the substrate,
   wherein the light shielding portions comprises a first light shielding sub-portion and a second light shielding sub-portion, both arranged in a column direction of the pixel unit, wherein an orthographic projection of a side of the first light shielding sub-portion toward the first pixel sub-electrode on the substrate is overlapped with the orthographic projection of the data line corresponding to the light shielding portion on the substrate, and an orthographic projection of a side of the second light shielding sub-portion away from the second pixel sub-electrode on the substrate is overlapped with an orthographic projection of the data line corresponding to the light shielding portion on the substrate,
   wherein the light shielding portion is a metal light shielding layer electrically connected to the gate line and a common electrode signal line, wherein the first light shielding sub-portion and the second light shielding sub-portion are electrically connected to each other and disposed in a same layer, an end of the first light shielding sub-portion away from the second light shielding sub-portion is electrically connected to the gate line, and an end of the second light shielding sub-portion away from the first light shielding sub-portion is electrically connected to the common electrode signal line.

2. A display panel, comprising an array substrate, wherein the array substrate comprises:

a substrate;

a plurality of data lines and a plurality of gate lines which are formed on the substrate and crossed with each other; and a pixel unit formed in an area defined by two adjacent data lines and two adjacent gate lines, wherein the pixel unit comprises a pixel electrode and a light shielding portion that corresponds to the data line, and wherein an orthographic projection of the light shielding portion on the substrate is partially overlapped with an orthographic projection of the corresponding data line on the substrate, and wherein, each side, that is parallel to the data line, of an orthographic projection of the pixel electrode on the substrate comprises a first part which is overlapped only with the orthographic projection of the data line on the substrate and a second part which is overlapped only with the orthographic projection of the light shielding portion on the substrate, wherein the pixel electrode comprises a first pixel sub-electrode and a second pixel sub-electrode, both arranged in a column direction of the pixel unit, fabricated in a same layer and electrically connected to each other, wherein the first pixel sub-electrode has two sides that are parallel to the data line, an orthographic projection of one of the two sides on the substrate is overlapped with the orthographic projection of the data line adjacent to the one of the two sides of the pixel electrode on the substrate, and an orthographic projection of the other one of the two sides on the substrate is overlapped with the orthographic projection of the light shielding portion corresponding to the data line adjacent to the other one of the two sides of the pixel electrode on the substrate, wherein the second pixel sub-electrode has two sides that are parallel to the data line, an orthographic projection of one of the two sides on the substrate is overlapped with the orthographic projection of the data line adjacent to the one of the two sides of the pixel electrode on the substrate, and an orthographic projection of the other side of the two sides on the substrate is overlapped with the orthographic projection of the light shielding portion corresponding to the data line adjacent to the other one of the two sides of the pixel electrode on the substrate, wherein the light shielding portions comprises a first light shielding sub-portion and a second light shielding sub-portion, both arranged in a column direction of the pixel unit, wherein an orthographic projection of a side of the first light shielding sub-portion toward the first pixel sub-electrode on the substrate is overlapped with the orthographic projection of the data line corresponding to the light shielding portion on the substrate, and an orthographic projection of a side of the second light shielding sub-portion away from the second pixel sub-electrode on the substrate is overlapped with an orthographic projection of the data line corresponding to the light shielding portion on the substrate, wherein the light shielding portion is a metal light shielding layer electrically connected to the gate line and a common electrode signal line, wherein the first light shielding sub-portion and the second light shielding sub-portion are electrically connected to each other and disposed in a same layer, an end of the first light shielding sub-portion away from the second light shielding sub-portion is electrically connected to the gate line, and an end of the second light shielding sub-portion away from the first light shielding sub-portion is electrically connected to the common electrode signal line.

3. A display device, comprising a display panel having an array substrate, wherein the array substrate comprises:

a substrate;

a plurality of data lines and a plurality of gate lines which are formed on the substrate and crossed with each other; and a pixel unit formed in an area defined by two adjacent data lines and two adjacent gate lines, wherein the pixel unit comprises a pixel electrode and a light shielding portion that corresponds to the data line, and wherein an orthographic projection of the light shielding portion on the substrate is partially overlapped with an orthographic projection of the corresponding data line on the substrate, and wherein, each side, that is parallel to the data line, of an orthographic projection of the pixel electrode on the substrate comprises a first part which is overlapped only with the orthographic projection of the data line on the substrate and a second part which is overlapped only with the orthographic projection of the light shielding portion on the substrate, wherein the pixel electrode comprises a first pixel sub-electrode and a second pixel sub-electrode, both arranged in a column direction of the pixel unit, fabricated in a same layer and electrically connected to each other, wherein the first pixel sub-electrode has two sides that are parallel to the data line, an orthographic projection of one of the two sides on the substrate is overlapped with the orthographic projection of the data line adjacent to the one of the two sides of the pixel electrode on the substrate, and an orthographic projection of the other one of the two sides on the substrate is overlapped with the orthographic projection of the light shielding portion corresponding to the data line adjacent to the other one of the two sides of the pixel electrode on the substrate, wherein the second pixel sub-electrode has two sides that are parallel to the data line, an orthographic projection of one of the two sides on the substrate is overlapped with the orthographic projection of the data line adjacent to the one of the two sides of the pixel electrode on the substrate, and an orthographic projection of the other side of the two sides on the substrate is overlapped with the orthographic projection of the light shielding portion corresponding to the data line adjacent to the other one of the two sides of the pixel electrode on the substrate, wherein the light shielding portions comprises a first light shielding sub-portion and a second light shielding sub-portion, both arranged in a column direction of the pixel unit, wherein an orthographic projection of a side of the first light shielding sub-portion toward the first pixel sub-electrode on the substrate is overlapped with the orthographic projection of the data line corresponding to the light shielding portion on the substrate, and an orthographic projection of a side of the second light shielding sub-portion away from the second pixel sub-electrode on the substrate is overlapped with an orthographic projection of the data line corresponding to the light shielding portion on the substrate,
wherein the light shielding portion is a metal light shielding layer electrically connected to the gate line and a common electrode signal line,
wherein the first light shielding sub-portion and the second light shielding sub-portion are electrically connected to each other and disposed in a same layer, an end of the first light shielding sub-portion away from the second light shielding sub-portion is electrically connected to the gate line, and an end of the second light shielding sub-portion away from the first light shielding sub-portion is electrically connected to the common electrode signal line.

* * * * *